(12) United States Patent
Kim et al.

(10) Patent No.: US 8,704,211 B2
(45) Date of Patent: Apr. 22, 2014

(54) HIGH INTEGRITY PROTECTIVE COATINGS

(75) Inventors: Tae Won Kim, Clifton Park, NY (US);
Min Yan, Ballston Lake, NY (US);
Christian Maria Anton Heller, Albany, NY (US); Marc Schaepkens, Medina, OH (US); Thomas Bert Gorczyca, Schenectady, NY (US); Paul Alan McConnelee, Schenectady, NY (US); Ahmet Gun Erlat, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 2730 days.

(21) Appl. No.: 10/988,481

(22) Filed: Nov. 15, 2004

(65) Prior Publication Data
US 2006/0001040 A1    Jan. 5, 2006

Related U.S. Application Data

(63) Continuation-in-part of application No. 10/879,468, filed on Jun. 30, 2004, now Pat. No. 7,449,246.

(51) Int. Cl.
*H01L 35/24* (2006.01)
*H01L 51/00* (2006.01)

(52) U.S. Cl.
USPC .............. 257/40; 257/642; 257/E25.008

(58) Field of Classification Search
USPC ................... 257/40, 642, E25.008
See application file for complete search history.

(56) References Cited

U.S. PATENT DOCUMENTS

| | | | | |
|---|---|---|---|---|
| 2,951,772 A * | 9/1960 | Marzocchi et al. | ........... | 523/209 |
| 3,720,562 A * | 3/1973 | Drelich | ........... | 156/291 |
| 4,234,533 A * | 11/1980 | Langlands | ........... | 264/261 |
| 4,861,671 A | 8/1989 | Muchnik et al. | | |
| 5,151,318 A * | 9/1992 | Strasilla et al. | ........... | 428/42.2 |
| 5,194,293 A * | 3/1993 | Foster | ........... | 427/512 |
| 5,510,140 A * | 4/1996 | Kurose et al. | ........... | 427/131 |
| 5,643,638 A * | 7/1997 | Otto et al. | ........... | 427/569 |
| 5,712,695 A * | 1/1998 | Tanaka et al. | ........... | 349/79 |
| 5,736,207 A * | 4/1998 | Walther et al. | ........... | 428/34.7 |
| 6,300,040 B1 * | 10/2001 | Lewis | ........... | 430/302 |
| 6,492,026 B1 * | 12/2002 | Graff et al. | ........... | 428/411.1 |
| 6,495,208 B1 * | 12/2002 | Desu et al. | ........... | 427/255.31 |
| 6,537,688 B2 | 3/2003 | Silvernail et al. | | |
| 6,573,652 B1 | 6/2003 | Graff | | |
| 6,614,057 B2 | 9/2003 | Silvernail et al. | | |
| 6,664,137 B2 | 12/2003 | Weaver | | |
| 6,737,145 B1 * | 5/2004 | Watanabe et al. | ........... | 428/64.4 |
| 6,737,753 B2 | 5/2004 | Kumar et al. | | |
| 6,836,070 B2 * | 12/2004 | Chung et al. | ........... | 313/512 |

(Continued)

FOREIGN PATENT DOCUMENTS

JP    11129423 A    5/1999
WO    WO 03/087247    10/2003

OTHER PUBLICATIONS

PCT International Search Report dated Aug. 28, 2007.

*Primary Examiner* — Charles Garber
*Assistant Examiner* — Ron Pompey
(74) *Attorney, Agent, or Firm* — Jean Testa; Fletcher Yoder

(57) ABSTRACT

A composite article with at least one high integrity protective coating, the high integrity protective coating having at least one planarizing layer and at least one organic-inorganic composition barrier coating layer. A method for depositing a high integrity protective coating.

32 Claims, 11 Drawing Sheets

(56) References Cited

U.S. PATENT DOCUMENTS

| | | |
|---|---|---|
| 6,911,667 B2 | 6/2005 | Pichler |
| 7,015,640 B2 * | 3/2006 | Schaepkens et al. ......... 313/506 |
| 7,048,823 B2 * | 5/2006 | Bermel ......................... 156/344 |
| 7,229,703 B2 | 6/2007 | Kawashima |
| 7,397,183 B2 * | 7/2008 | Schaepkens et al. ......... 313/512 |
| 7,399,991 B2 * | 7/2008 | Seo et al. ....................... 257/79 |
| 7,531,243 B2 | 5/2009 | Naruse |
| 2003/0104753 A1 | 6/2003 | Graff et al. |
| 2003/0205845 A1 | 11/2003 | Pichler et al. |
| 2004/0031977 A1 | 2/2004 | Brown et al. |
| 2004/0119068 A1 | 6/2004 | Weaver |
| 2004/0121146 A1 | 6/2004 | He et al. |
| 2004/0152390 A1 | 8/2004 | Chung et al. |
| 2004/0209126 A1 | 10/2004 | Ziegler et al. |
| 2004/0219380 A1 * | 11/2004 | Naruse et al. ................. 428/500 |

* cited by examiner

Bare Substrate

Substrate With A Planarizing Layer Coating

US 8,704,211 B2

HIGH INTEGRITY PROTECTIVE COATINGS

CROSS REFERENCE TO RELATED APPLICATIONS

This application is a Continuation-In-Part of U.S. patent application Ser. No. 10/879,468, entitled "BARRIER COATINGS", filed Jun. 30, 2004 now U.S. Pat. No. 7,449,246, which is herein incorporated by reference.

STATEMENT REGARDING FEDERALLY SPONSORED RESEARCH & DEVELOPMENT

This invention was made with Government support under contract number RFP01-63GE awarded by United States Display Consortium and Army Research Laboratory. The Government has certain rights in the invention.

BACKGROUND

The invention relates generally to protective coatings. More specifically, the invention relates to protective coatings that are used in optoelectronic devices.

Optical and optoelectronic devices that are susceptible to reactive chemical species normally encountered in the environment, require protective coatings with good barrier properties. Quite often substrates, especially polymeric substrates on which these devices may be a manufactured, are not atomically smooth and have surface spikes that are hundreds of nanometers high. Also, the exposed surfaces of these devices may be scratched and damaged during fabrication and/or transportation. These surface defects may often limit the performance of these devices. Defects could lead to a short in the device by forming a contact between anode and cathode and pinholes in various functional coatings could help the permeation of moisture, oxygen and possibly other deleterious materials.

It would therefore be desirable to have coatings that are substantially smooth and defect free, having low permeation rates for chemically reactive species such as oxygen and water vapor and are chemically resistant to commonly used chemicals for device fabrication to protect an unencapsulated device or protect other functional layers or coatings in a device.

BRIEF DESCRIPTION

One aspect of this invention is a composite article comprising at least one high integrity protective coating, the high integrity protective coating comprising at least one planarizing layer and at least one organic-inorganic composition barrier coating layer.

Another aspect of the invention is a method for depositing a high integrity protective coating. The method comprising the steps of preparing a substantially homogenous resin based planarizing layer composition, providing at least one surface for deposition; depositing the planarizing layer composition on the surface, curing the planarizing layer composition, depositing reaction or recombination products of reacting species on the planarizing layer, and changing the composition of the reactants fed into the reactor chamber during deposition to form an organic-inorganic composition barrier coating layer.

A further aspect of the invention is a device assembly comprising a device, at least one surface of which is coated with at least one protecting coating.

DRAWINGS

These and other features, aspects, and advantages of the present invention will become better understood when the following detailed description is read with reference to the accompanying drawings in which like characters represent like parts throughout the drawings, wherein:

FIG. 1 graphically shows light transmittance through identical substrates having organic-inorganic composition barrier coatings with and without refractive index matching.

Figure 11:
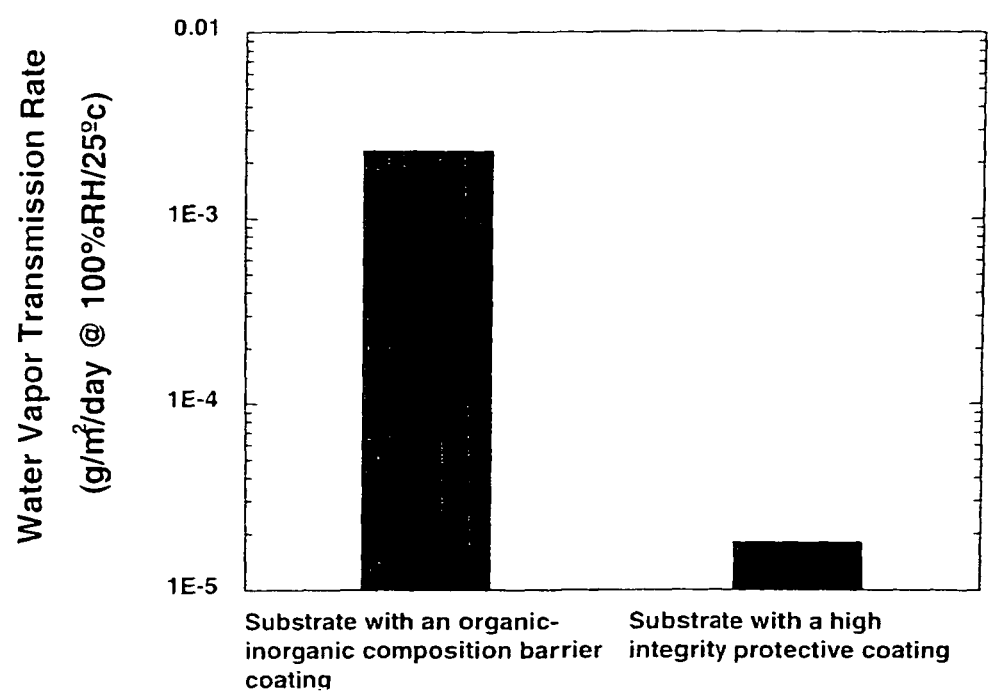

FIG. 11 graphically shows water vapor transmittance rate (WVTR) through identical substrates (a) with a barrier coating of organic-inorganic composition and (b) with a high integrity protective coating in accordance with one aspect of the present invention.

Figure 12:
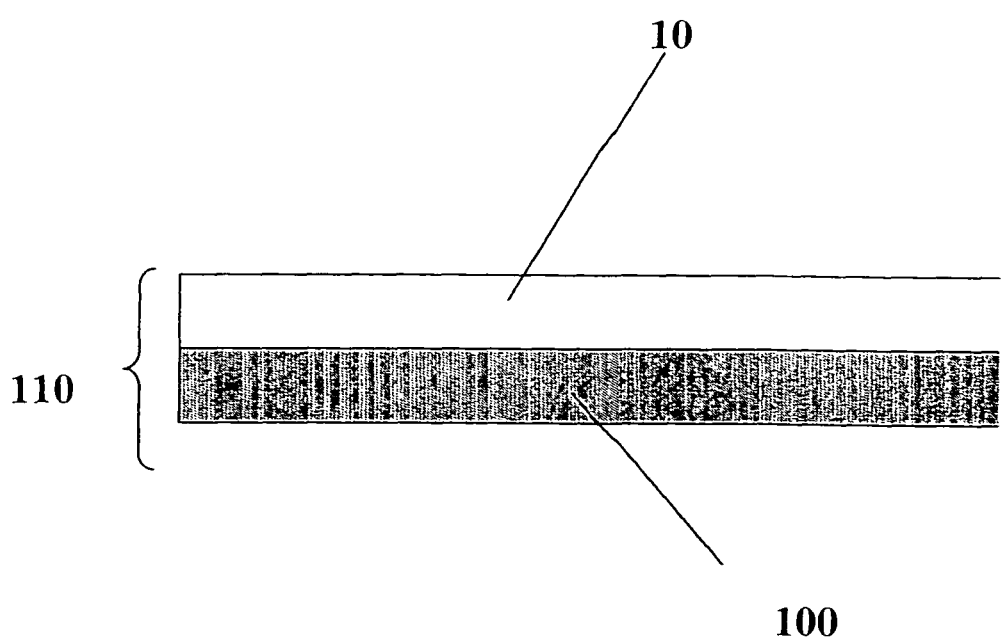

FIG. 12 shows schematically an embodiment of a high integrity protective coating of the present invention.

Figure 13:
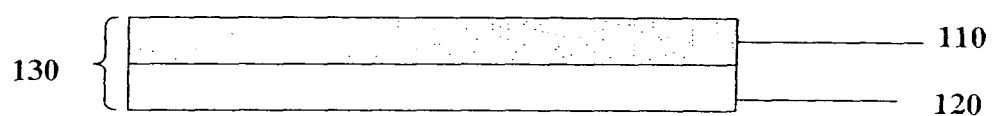

FIG. 13 shows schematically a first embodiment of a composite article of the present invention with a high integrity protective coating.

Figure 14:
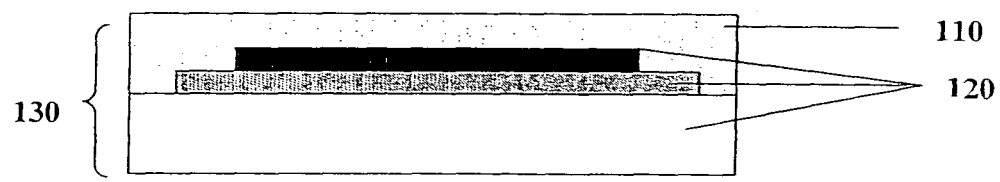

FIG. 14 shows schematically a second embodiment of a composite article of the present invention with a high integrity protective coating.

Figure 15:
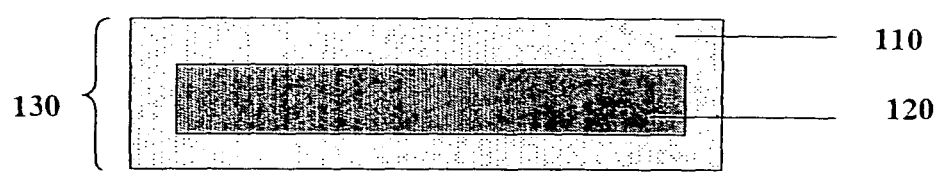

FIG. 15 shows schematically a third embodiment of a composite article composite article of the present invention with a high integrity protective coating.

DETAILED DESCRIPTION

The barrier coating of the present invention will be termed interchangeably hereinafter as an "organic-inorganic composition barrier coating," "barrier coating of organic-inorganic composition," or simply "organic-inorganic barrier coating."

Light emitting and light absorbing materials and electrode materials in optoelectronic devices, especially in organic optoelectronic devices, are all susceptible to attack by reactive species existing in the environment, such as oxygen, water vapor, hydrogen sulfide, SOx, NOx, solvents, etc. Barrier coatings engineered to affect light transmission only to a small extent are useful in extending the device lifetime without degrading the overall device efficiency, thus rendering them commercially viable. Desirable barrier properties are achieved in the coating of the present invention by using an organic-inorganic composition and desirable light transmission is achieved by matching refractive indices of inorganic zones and organic zones in the coating.

One aspect of this invention is a composite article comprising a barrier coating of organic-inorganic composition, the barrier coating having optical properties that are substantially uniform along an axis of light transmission oriented substantially perpendicular to the surface of the coating. "Substantially perpendicular" means within 15 degrees either side of a perpendicular to a tangent drawn at any point on the surface. In a preferred embodiment, the substantially uniform optical properties provides for a coating with a substantially uniform refractive index. "Substantially uniform refractive index" means the refractive index of any zone in the coating is within 10% of any other zone in the coating for a selected wavelength. The barrier coating preserves color neutrality by exhibiting substantially uniform light transmission. "Substantially uniform light transmission" means at any selected wavelength in a selected wavelength range, the transmission is within 10% of the average light transmission for the wavelength range, in other words, the barrier coating does not substantially differentially attenuate wavelengths within the selected wavelength range. The barrier coating is constructed with zones of various compositions. The oxygen and water vapor barrier properties are enhanced by the inorganic-organic composition. Optical loss due to interference resulting from differing refractive indices of the zones of various compositions is overcome by depositing substantially uniform refractive-index materials. The desired transmissivity is achieved by matching the refractive indices of zones in the coating.

Figure 1:
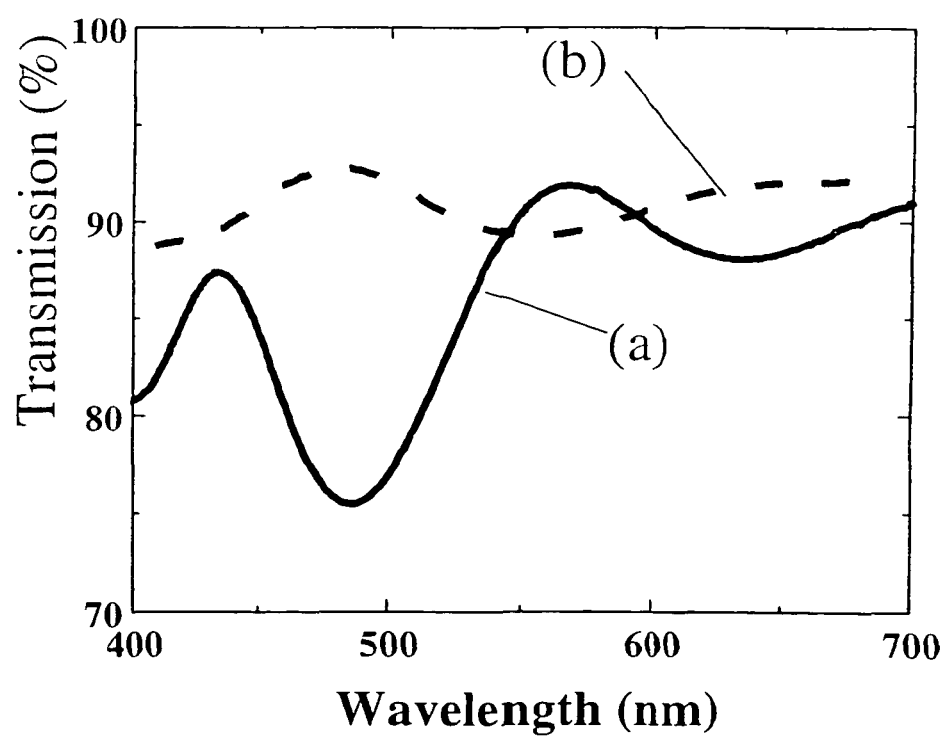

In optoelectronic devices one of the important performance parameters is optical efficiency. Therefore it is desirable that any coating used in such a device to enhance other performance parameters, does not compromise the optical efficiency due to light absorption or other factors. Therefore it is important that barrier coatings be substantially transparent. The term "substantially transparent" means allowing a total transmission of at least about 50 percent, preferably at least about 80 percent, and more preferably at least 90 percent, of light in a selected wavelength range. The selected wavelength range can be in the visible region, the infrared region, the ultraviolet region or combinations thereof. For example, a 5 mil polycarbonate substrate with a barrier coating of the present invention, light transmittance along the axis of light transmission is greater than 85% for all wavelengths in the visible light wavelength region about 400 nanometers to about 700 nanometers. FIG. 1 compares the visible light transmittance through a substrate with a barrier coating of organic-inorganic composition without refractive index matching (a) with a refractive index matched barrier coating of organic-inorganic composition (b). FIG. 1 shows a transmissivity greater than 85% for the visible wavelength with no large amplitude interference fringes for the barrier coating of the present invention. Therefore the barrier coating of the present invention is desirably substantially transparent in the visible wavelength range.

The barrier coating of the present invention consists of at least one substantially transparent inorganic zone and at least one substantially transparent organic zone having low permeability of oxygen or other reactive materials present in the environment. By low permeability it is meant that the oxygen permeability is less than about $0.1$ $cm^3/(m^2\ day)$, as measured at $25°$ C. and with a gas containing 21 volume-percent oxygen and the water vapor transmission is less than about $1$ $g/(m^2\ day)$, as measured at $25°$ C. and with a gas having 100-percent relative humidity.

Figure 2:
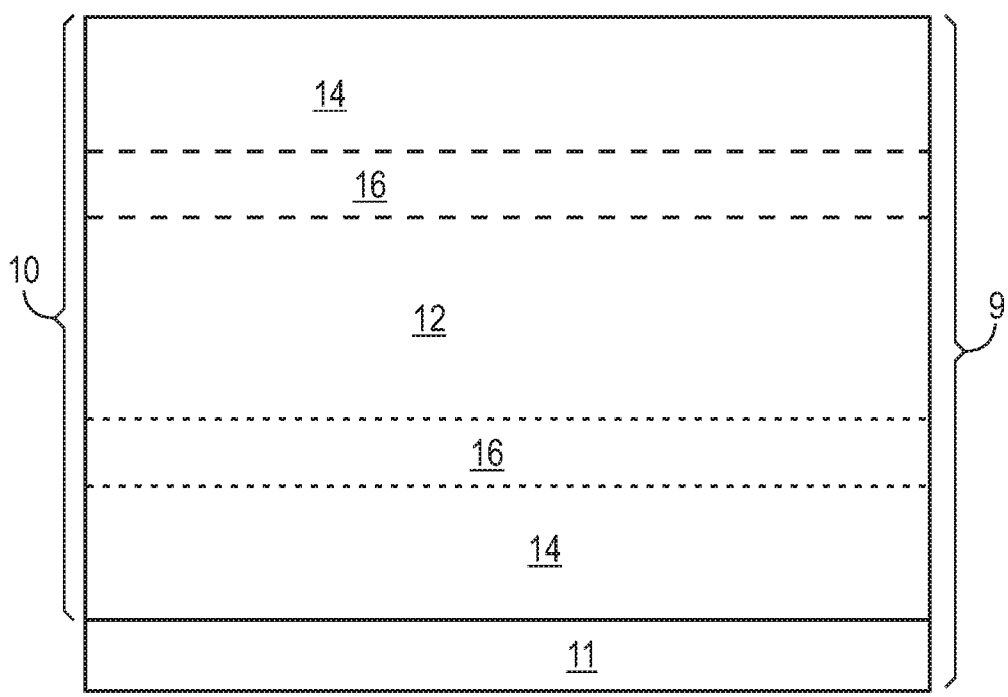
FIG. 2 shows schematically an embodiment of an organic-inorganic composition barrier coating of the present invention.

Referring to drawings in general and to FIG. 2 in particular, the illustrations are for the purpose of describing an embodiment or aspect of the invention and are not intended to limit the invention. FIG. 2 shows schematically a high integrity protective coating 9 comprising a planarizing layer 11 coupled to a barrier coating 10, including a substantially organic zone 12, a substantially inorganic zone 14 and an organic-inorganic interface zone 16. The term "substantially organic" means the composition is over 90% organic. The term "substantially inorganic" means the composition is over 90% inorganic. Although, any number of zones can be present in the barrier coating, at least two, a substantially organic zone 12 and a substantially inorganic zone 14, is suitable for reduction of moisture, oxygen and other reactive species. Typical thickness of respective substantially organic zones 12 is 100 nanometers to 1 micron. Typical thickness of respective substantially inorganic zones 14 is 10 nanometers to 100 nanometers. Typical thickness of respective transitional zones 16 is 5 nanometers to 30 nanometers. In one embodiment, the substantially organic zone 12 is of uniform composition. In another embodiment, the substantially organic zone 12 is of a composition that varies across the thickness of the zone. In another embodiment all substantially organic zones 12 in a barrier coating are of same composition. In another embodiment at least two of the organic zones 12 are of different composition. In one embodiment, the substantially inorganic zone 14 is of uniform composition. In another embodiment, the substantially organic zone 14 is of a composition that varies across the thickness of the zone. In another embodiment, all substantially organic zones 14 in a barrier coating are of same composition. In another embodiment at least two of the organic zones 14 are of different composition. Other embodiments may include transitional zones 16 that are neither substantially organic nor substantially inorganic. It should be clearly understood that the zones are not layers. The zones do not have distinct boundaries.

Thus, a coating of the present invention does not have distinct interfaces at which the composition of the coating changes abruptly. It should also be noted that the composition of the barrier coating does not necessarily vary monotonically from one surface to the other surface thereof. A monotonically varying composition is only one case of barrier coating of the present invention.

Figure 3:
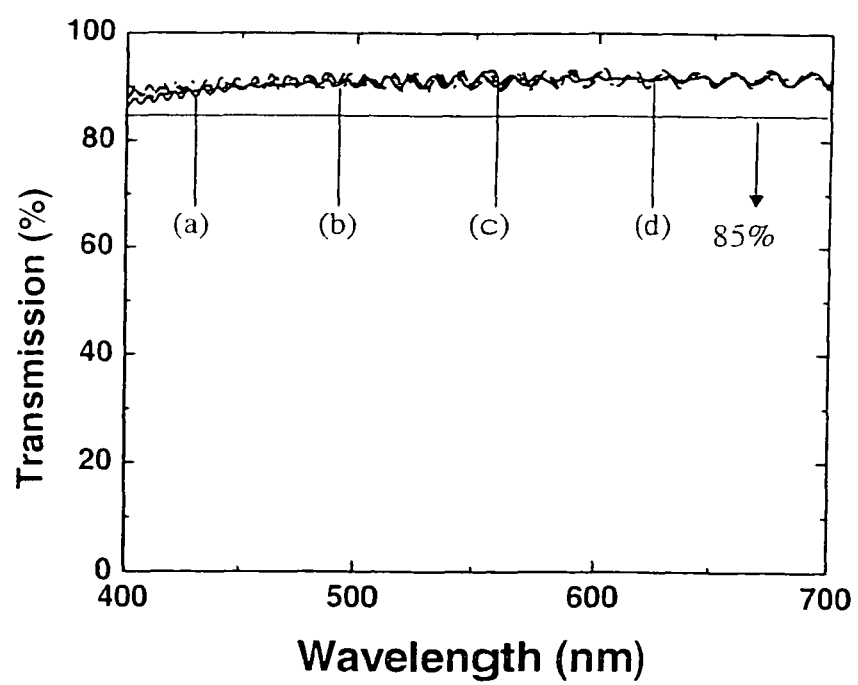
FIG. 3 shows light transmittance spectra for an organic-inorganic composition barrier coating of the present invention with varying number of zones and varying zone thicknesses.

FIG. 3 shows transmission spectra for barrier coatings with varying number of zones and varying organic zone thickness. Transmission spectra as shown in FIG. 3 for barrier coatings with 100 nm silicon oxycarbide substantially organic zone between two 30 nm silicon oxynitride substantially inorganic zones (a), with 300 nm silicon oxycarbide substantially organic zone between two 30 nm silicon oxynitride substantially inorganic zones (b), with 600 nm silicon oxycarbide substantially organic zone between two 30 nm silicon oxynitride substantially inorganic zones (c) and with two 300 nm silicon oxycarbide substantially organic zone alternating with three 30 nm silicon oxynitride substantially inorganic zones (d), clearly demonstrate that the transmission efficiency of the barrier coating is affected only in a small way by increasing the number of zones or by increasing thickness of the organic zones in the coating. This invention thereby preserves good transmission efficiency even with thick organic zones and with multiple organic and inorganic zones, which will aid in improving the barrier properties of the coating. All barrier coatings in this example have 10 nm transitional zones between the substantially organic and substantially inorganic zones.

Suitable coating compositions of regions across the thickness are organic, and inorganic materials and combinations thereof. These materials are typically reaction or recombination products of reacting plasma species and are deposited onto the substrate surface. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic coating materials typically comprise oxide; nitride; carbide; boride; or combinations thereof of elements of Groups IIA, IIIA, IVA, VA, VIA, VIIA, IB, and IIB; metals of Groups IIIB, IVB, IVB, and VB; and rare-earth metals.

Figure 4:
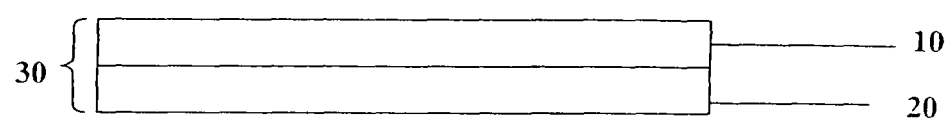
FIG. 4 shows schematically a first embodiment of a composite article with an organic-inorganic composition barrier coating.
Figure 5:
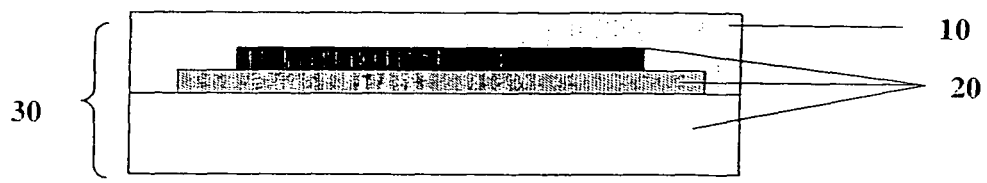
FIG. 5 shows schematically a second embodiment of a composite article with an organic-inorganic composition barrier coating.
Figure 6:
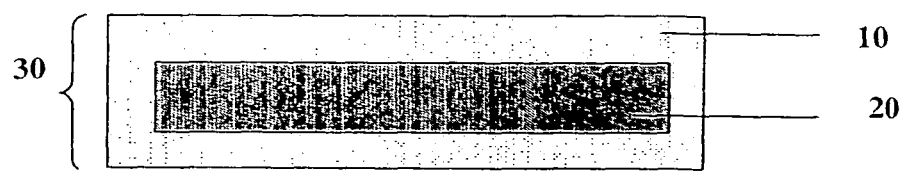
FIG. 6 shows schematically a third embodiment of a composite article with an organic-inorganic composition barrier coating.

In one embodiment of a composite article of the present invention, as shown in FIG. 4, at least one barrier coating 10 is disposed on at least one surface of an element or substrate 20, of the composite article 30. In another embodiment of a composite article of the present invention, as shown in FIG. 5 at least one barrier coating 10 disposed on at least one surface of more than one element 20 of the composite article. In a third embodiment of a composite article 30 of the present invention, as shown in FIG. 6, at least one barrier coating 10 encapsulates at least one substrate or element 20 of the composite article 30.

In another embodiment of a composite article, at least one element is an optoelectronic element. In a further preferred embodiment of a composite article, the optoelectronic element is an organic element. In one embodiment of a composite article the optoelectronic element is an electroluminescent element. In another embodiment of a composite article the optoelectronic element is a photoresponsive element.

In another embodiment, a composite article includes a polymeric substrate and an active element, which is an organic electroluminescent element.

The composite article may include additional elements such as, but not limited to, an adhesion layer, abrasion resistant layer, chemically resistant layer, photoluminescent layer radiation-absorbing layer, radiation reflective layer, conductive layer, electrode layer, electron transport layer, hole transport layer and charge blocking layer.

Another aspect of the invention is a method for depositing the barrier coatings of organic-inorganic composition. The method comprising the steps of providing at least one surface for deposition, depositing reaction or recombination products of reacting species on the surface, changing the compositions of the reactants fed into the reactor chamber during the deposition to form an organic-inorganic coating with at least one substantially organic zone and at least one substantially inorganic zone, and performing refractive index modification of at least one inorganic zone by varying the precursor gas composition, the refractive index of the inorganic zone being adjusted to provide a substantially uniform refractive index along an axis of light transmission through the barrier coating.

A bulk material or a substrate having a surface for deposition typically is a single piece or a structure comprising a plurality of adjacent pieces of different materials. Non-limiting examples of a substrate include a rigid transparent glass and a flexible or rigid polymeric substrate.

Non-limiting examples of substrate materials that benefit from having a organic-inorganic composition barrier coating are organic polymeric materials; such as polyethyleneterephthalate ("PET"); polyacrylates; polycarbonate; silicone; epoxy resins; silicone-functionalized epoxy resins; polyester such as Mylar (made by E.I. du Pont de Nemours & Co.); polyimide such as Kapton H or Kapton E (made by du Pont), Apical AV (made by Kanegafugi Chemical Industry Company), Upilex (made by UBE Industries, Ltd.); polyethersulfones ("PES," made by Sumitomo); polyetherimide such as Ultem (made by General Electric Company); and polyethylenenaphthalene ("PEN").

The coating can be formed using one of many deposition techniques, such as plasma-enhanced chemical-vapor deposition, radio-frequency plasma-enhanced chemical-vapor deposition, microwave plasma enhanced chemical vapor deposition, expanding thermal-plasma chemical-vapor deposition, sputtering, reactive sputtering, electron-cyclotron-resonance plasma-enhanced chemical-vapor deposition, inductively-coupled plasma-enhanced chemical-vapor deposition, and combinations thereof. Information regarding all deposition techniques is generally known and readily available.

For example, silicon carbide can be deposited on a surface by recombination of plasmas generated from silane ($SiH_4$) and an organic material, such as methane or xylene. Silicon oxycarbide can be deposited from plasmas generated from silane, methane, and oxygen or silane and propylene oxide. Silicon oxycarbide also can be deposited from plasmas generated from organosilicone precursors, such as Vinyl trimethylsilane (VTMS), tetraethoxysilane (TEOS), hexamethyldisiloxane (HMDSO), hexamethyldisilazane (HMDSN), or octamethylcyclotetrasiloxane (D4). Aluminum oxycarbonitride can be deposited from a plasma generated from a mixture of aluminum tartrate and ammonia. Other combinations of reactants may be chosen to obtain a desired coating composition. The choice of particular reactants is within the skills of the artisans. A mixed composition of the coating is obtained by changing the compositions of the reactants fed into the reactor chamber during the deposition of reaction products to form the coating.

Figure 7:
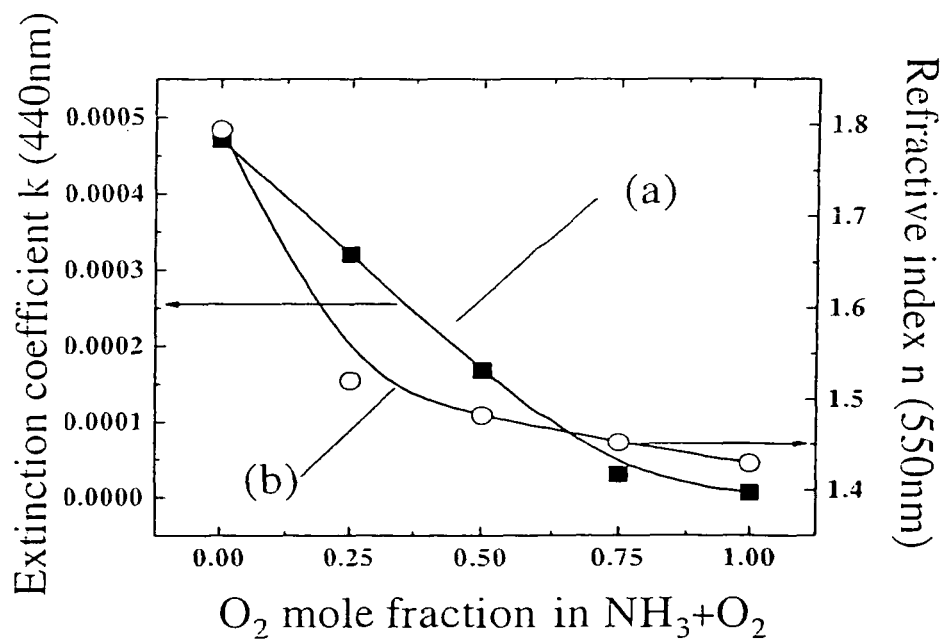
FIG. 7 shows variation in refractive index and extinction coefficient with variation in oxygen mole fraction in precursor feed gas during deposition.

For example, when the coating on a surface is desired to comprise silicon nitride, the first reactant gas can be ammonia, and the second reactant gas can be silane. The relative supply rates of reactant gases are varied during deposition to vary the composition of the deposited material as the coating is built up. If oxygen is used as an additional precursor gas, and the mole fraction of oxygen in the feed gas is increased from zero, the material deposited on the surface changes from silicon nitride to silicon oxynitride. As the oxygen mole fraction in the reactant gas increases, oxygen starts to replace nitrogen in the deposited material. Compositional and structural changes occur with increase in oxygen mole fraction, resulting in refractive index modification as well. Therefore, in this example, refractive index modification is achieved by varying the mole fraction of a constituent reactant in the precursor. FIG. 7 shows the variation of refractive index with variation in oxygen mole fraction, for a precursor composition including, ammonia and oxygen. For example, if the substantially organic zone of silicon oxycarbide having a refractive index at 550 nm of about 1.5 is used in the coating, then a substantially inorganic zone of silicon oxynitride, at an oxygen mole fraction of about 0.25, is also deposited such that the refractive index of the inorganic zone matches the refractive index of the substantially organic zone of silicon oxycarbide, resulting in a barrier coating of organic-inorganic composition with substantially uniform refractive index.

FIG. 7 shows measured optical properties, refractive index (a) and extinction coefficient (b), of inorganic layers deposited with varying oxygen mole fraction, obtained by spectroscopic ellipsometry. In this example, depending on the oxygen mole fraction in the precursor feed gases, refractive index of the depositing inorganic material varies from 1.8 to 1.4. Thus, by selecting a process condition, which results in refractive index of depositing inorganic material close to that of organic material, the interference amplitude can be reduced significantly. FIG. 7 also indicates that the extinction coefficient (b) does not change enough to significantly affect the absorption of light through the inorganic layers for thicknesses of inorganic layers used in this invention.

Figure 8:
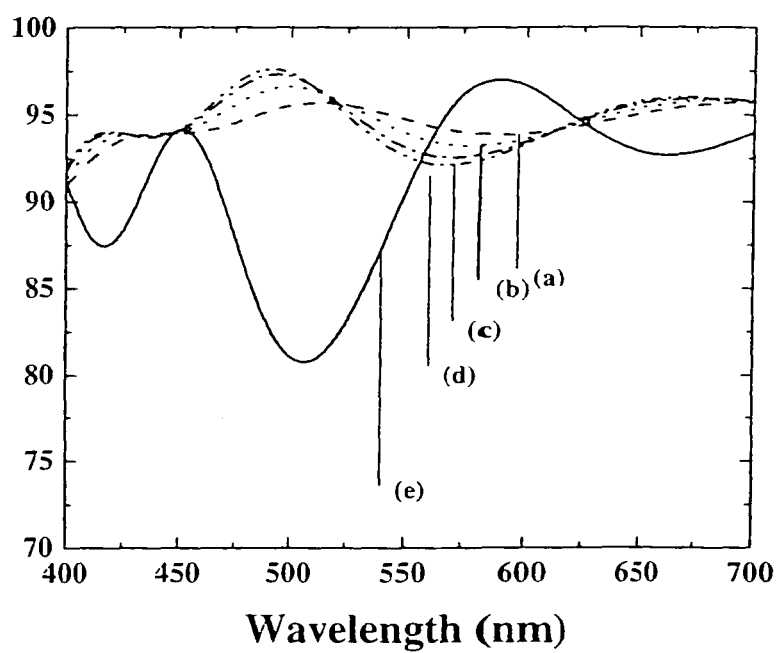
FIG. 8 shows calculated visible light transmittance spectra as a function of oxygen mole fraction in feed gas during deposition.

FIG. 8 shows visible light transmittance spectra through the barrier coating for different oxygen mole fractions 0.0 (a), 0.25 (b), 0.5 (c), 0.75, (d) and 1.0 (e) in precursor feed gas calculated using measured optical properties such as refractive index n and extinction coefficient k. In this example visible light transmittance with minimum interference fringes are achieved at about 0.25 oxygen mole fraction indicating that the refractive index of the inorganic material deposited under this process condition matches the refractive index of the organic material deposited In another embodiment of the present invention, a region between the substrate or element with the coating and the coating is diffuse, such that there is a gradual change from the composition of the bulk of the substrate or element to the composition of the portion of the coating. Such a transition prevents an abrupt change in the composition and mitigates any chance for delamination of the coating. The gradual change of the coating composition is achieved by the gradual change of the precursor composition.

A further aspect of the invention is a device assembly comprising a device, at least one surface of which is coated with at least one barrier coating, the composition of which varies across the thickness of the coating and has substantially uniform refractive index along the axis of light transmission. Such device assemblies include, but are not limited to, liquid crystal displays, light emitting devices, photo-responsive devices, integrated circuits and components of medical diagnostic systems.

The device assembly may comprise a device disposed on a flexible substantially transparent substrate, said substrate having a first substrate surface and a second substrate surface, at least one of said substrate surface being coated with the barrier coating of the present invention.

The barrier coatings of the present invention have many advantages, including being robust against environmentally reactive species, having desirable optical properties and being easily mass-produced. The fundamental advantage of the method of deposition of the present invention is that it enables concurrent control of optical and diffusion properties of barrier coatings by adjusting the deposition parameters. The barrier coatings of the present invention would be useful as barrier coatings in many optical and optoelectronic devices including organic light-emitting devices and organic photovoltaic devices.

Light emitting and light absorbing materials and electrode materials in optoelectronic devices, especially in organic optoelectronic devices, are all susceptible to attack by reactive species existing in the environment, such as oxygen, water vapor etc. Additionally, surface defects such as spikes and point defects on substrates or other functional layers could affect the performance of these devices. Desirable protective properties, to overcome these drawbacks and protect the device, are achieved in a coating of the present invention.

As used herein, the term "high integrity protective coating" refers to a coating wherein at least one planarizing layer is coupled to at least one organic-inorganic composition barrier coating layer.

One aspect of this invention is a composite article comprising a high integrity protective coating. The high integrity protective coating has at least one planarizing layer and at least one organic-inorganic composition barrier coating layer. Organic-inorganic composition barrier coatings are described in reference U.S. patent application Ser. No. 10/879,468, which is herein incorporated by reference. In some embodiments of the present invention, the planarizing layer thickness is in the range of about 1 nanometer to about 100 microns. Often the planarizing layer thickness is in the range of about 100 nanometers to about 10 micron. Very often the planarizing layer thickness is in the range of about 500 nanometers to about 5 microns.

Figure 9:
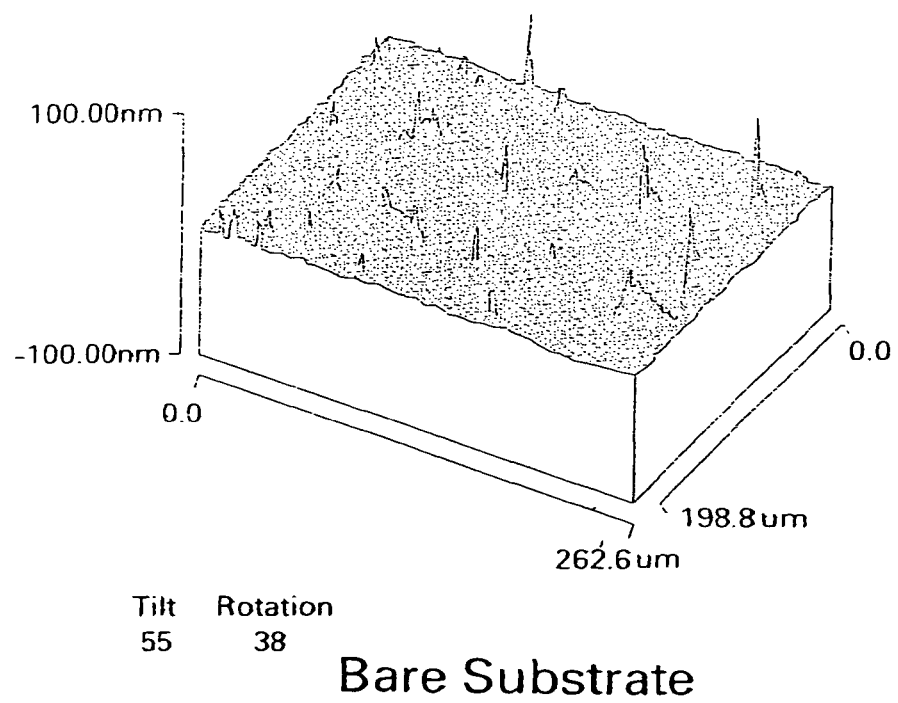
FIG. 9 shows a perspective view of a portion of a bare substrate obtained using optical profilometry.
Figure 10:
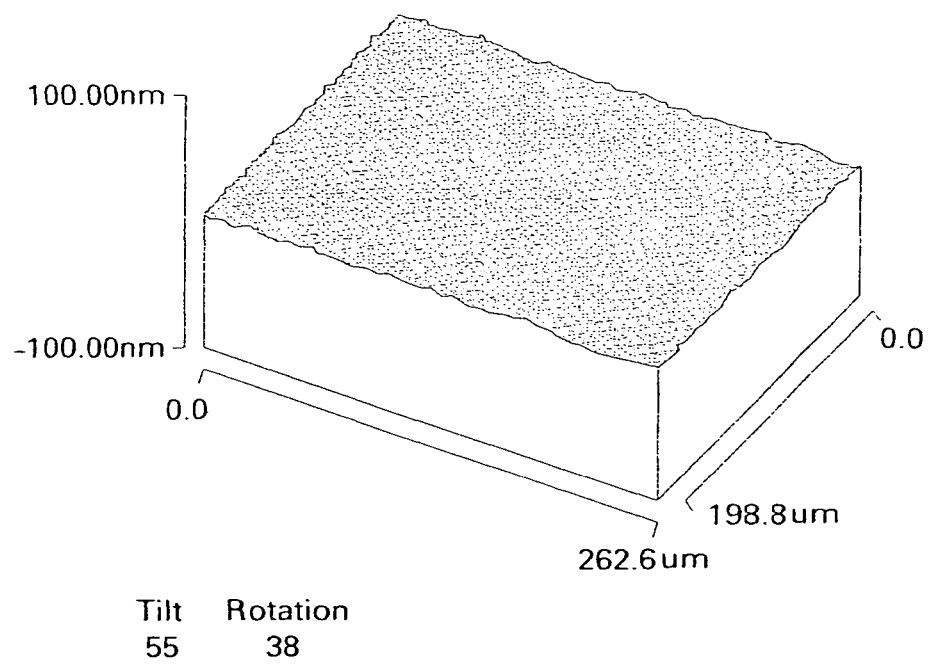
FIG. 10 shows a perspective view of a portion of a substrate with a planarizing layer obtained using optical profilometry.

The high integrity protective coating of the present invention is substantially smooth and substantially defect free. The term "average surface roughness" $R_a$ is defined as the integral of the absolute value of the roughness profile measured over an evaluation length. The term "peak surface roughness" $R_p$ is the height of the highest peak in the roughness profile over the evaluation length. The term "substantially smooth" means the average surface roughness $R_a$ is less than about 4 nanometers, preferably less than about 2 nanometers and more preferably less than about 0.75 nanometers and the peak surface roughness $R_p$ is less than about 10 nanometers, preferably less than 7 nanometers and more preferably less than 5.5 nanometers. Substantially defect free means the number of point defects is less than about $100/mm^2$, preferably less than $10/mm^2$, and more preferably $1/mm^2$. FIG. 9 shows an optical profilometry plot of a bare substrate surface and FIG. 10 shows an optical profilometry plot of a substrate surface with a planarizing layer in accordance with one aspect of the present invention.

The high integrity protective coating of the present invention includes at least one planarizing layer and at least one organic-inorganic composition barrier coating, the combination having low permeability of oxygen, water vapor and other reactive materials present in the environment. By low permeability it is meant that the oxygen permeability is less than about $0.1$ cm$^3$/(m$^2$ day), as measured at 25° C. and with a gas containing 21 volume-percent oxygen and the water vapor transmission rate is less than about $1\times10^{-2}$ g/(m$^2$ day), as measured at 25° C. and with a gas having 100-percent relative humidity. FIG. 11 graphically shows water vapor transmittance rate (WVTR) through identical substrates (a) with an organic-inorganic composition barrier coating and (b) with a high integrity protective coating in accordance with one aspect of the present invention. The WVTR measurements shown in FIG. 11 were obtained using a system with a detection limit of low $1\times10^{-6}$ g/(m$^2$ day). FIG. 11 shows that a substrate with a high integrity protective coating in accordance with one aspect of the present invention, formed by the combination of at least one planarizing layer and at least one organic-inorganic composition barrier coating layer, has a lower WVTR than a similar substrate with only an organic-inorganic composition barrier layer coating.

In one embodiment of a composite article of the present invention, a substrate with a high integrity protective coating has a light transmittance greater than 85% in a selected wavelength range between about 400 nanometers to about 700 nanometers.

In one aspect of the present invention, the planarizing layer composition comprises at least one resin. In a further aspect of the present invention, the resin is an epoxy based resin. For example, the resin could be a cycloaliphatic resin. In another aspect of the present invention, the resin is an acrylic based resin. Some epoxies impart increased surface durability, for example, increased resistance to scratch and damage that may likely happen during fabrication or transportation. Siloxane portion of certain diepoxies may be easily adjusted in length and branching to optimize desired properties.

The planarizing layer composition may further include at least one flexibilizing agent, adhesion promoter, surfactant or catalyst and combinations thereof. A flexibilizing agent helps make the planarizing layer less brittle, more flexible reducing cracking or peeling and generally reduce the stress the coating applies to the underlying element or substrate. An adhesion promoter helps improve adhesion between the substrate on the coating. For example, an adhesion promoter such as an organic silane coupling agent binds to a surface of a substrate or element and also to the subsequent film applied over the substrate or element. A surfactant helps lower the surface energy of the coating, allowing it to wet a substrate or element, and level better, providing a smoother, more uniform coating.

In still another aspect of the present invention, a planarizing layer composition may be cured. The curing may be radiation curing or thermal curing and combinations thereof. In one aspect of the present invention, said radiation curing is ultraviolet curing. Other curing mechanisms, including anydride or amine curing, can also be employed.

Additives can be incorporated into the planarizing layer to tailor its properties. For example, a UV catalyst may be added to the layer composition. In another example, UV absorbers can be added to protect underlying UV sensitive layers. Siloxane additives can be included to make the leveling layer more scratch resistant. Antioxidant chemicals such as Ciba Geigy's Irganox hindered amine complexes can also be added to prevent yellowing of the coating and underlying substrate.

Non-limiting example of substrate materials that benefit from having a high integrity protective coating are organic polymeric materials; such as polyethyleneterephthalate ("PET"); polyacrylates; polycarbonate; silicone; epoxy resins; silicone-functionalized epoxy resins; polyester such as Mylar (made by E.I. du Pont de Nemours & Co.); polyimide such as Kapton H or Kapton E (made by du Pont), Apical AV (made by Kanegafugi Chemical Industry Company), Upilex (made by UBE Industries, Ltd.); polyethersulfones ("PES," made by Sumitomo); polyetherimide such as Ultem (made by General Electric Company); and polyethylenenaphthalene ("PEN").

Non-limiting examples of cycloaliphatic epoxy resins are Dow ERL4221, ERL4299, ERLX4360, UVR600 and Silar Labs cycloaliphatic diepoxy disiloxane.

Non-limiting examples of UV curing agents are Dow UVI-6976, UVI-6992 Ciba Irgacure 250, and GE UV9380C.

Non-limiting examples of UV sensitizers are isopropylthioxanthone and ethyl dimethoxyanthracene.

Non-limiting examples of thermal catalysts are King Industries CXC-162, CXC-1614, XC-B220 and 3M FC520.

Non-limiting examples of surfactants are OSI Silwet 7001, 7604 GE SF1188A, SF1288, SF1488, BYK-Chemie BYK307 and Dow Triton X.

Non-limiting examples of flexiblizing agents are Dow DER 732 and 736, cyclohexane dimethanol, Celanese TCD alcohol DM, and King Industries Kflex 148 and 188.

Non-limiting examples of other additives which can be used are, anti-oxidants such as Ciba Irganox, UV absorbers such as Ciba Tinuvin and leveling agents such as BYK-Chemie BYK-361.

Referring to drawings in general and to FIG. 12 in particular, the illustrations are for the purpose of describing an embodiment or aspect of the invention and are not intended to limit the invention. FIG. 12 shows schematically a high integrity protective coating in accordance with one aspect of the present invention.

In one embodiment of a composite article of the present invention, as shown in FIG. 13, at least one high integrity protective coating 10 is disposed on at least one surface of an element or substrate 120, of the composite article 130. In another embodiment of a composite article of the present invention, as shown in FIG. 14, at least one high integrity protective coating 110 disposed on at least one surface of more than one element or substrate 120 of the composite article. In a third embodiment of a composite article 130 of the present invention, as shown in FIG. 15, at least one barrier coating 110 encapsulates at least one substrate or element 120 of the composite article 130.

A high integrity protective coating of the present invention can be applied to various types of substrates. In one aspect of the present invention, the composite article comprises a substrate. The substrate can be transparent or opaque. The substrate can be rigid or flexible. Non-limiting examples of a substrate include a rigid transparent glass and a flexible or rigid polymeric substrate. The high integrity protective coating can be applied to either blank substrate or unencapsulated optoelectronic device.

A high integrity protective coating of the present invention may be either optically transparent or opaque. A high integrity protective coating of the present invention may be flexible or rigid. A high integrity protective coating of the present invention may also provide mechanical protection to underlying substrate and coatings. In one aspect of this invention, the high integrity protective coating significantly reduces the surface roughness, wherein the average surface roughness is below about 0.75 nanometers and peak surface roughness is less than about 5.5 nanometers, and reduces the surface defect density, wherein the number of point defects is less than about 100/mm$^2$, of high glass transition temperature (Tg) polycarbonates. Additional functional coating can be deposited on top of the high integrity protective coating of this invention, the high integrity protective coating protecting a device or element from being damaged in subsequent deposition environment. For example, a high integrity protective coating can also be used as an etch-stop layer for the conductive coatings such as ITO coatings. In one embodiment of a high integrity protective coating of the present invention, a planarizing layer may be used as an interlayer between two organic-inorganic composition barrier coatings. A high integrity protective coating of the present invention can be used to release the stress between a top inorganic layer and bottom plastic substrate. The other side of a substrate with a high integrity protective coating can be coated with the same or different coating to balance the stress brought by adding of coating.

In one embodiment of a composite article of the present invention, at least one element is an optoelectronic element. In another embodiment of a composite article, the optoelectronic element is an organic element. In a further embodiment of the composite article the optoelectronic element is an electroluminescent element. In another embodiment of the composite article the optoelectronic element is a photoresponsive element.

In one embodiment of the composite article of the present invention includes a polymeric substrate and an active element, which is an organic electroluminescent element. A bulk material or a substrate having a surface for deposition typically is a single piece or a structure comprising a plurality of adjacent pieces of different materials.

The composite article may include additional elements such as, but not limited to, an adhesion layer, abrasion resistant layer, chemically resistant layer, photoluminescent layer radiation-absorbing layer, radiation reflective layer, conductive layer, electrode layer, electron transport layer, hole transport layer and charge blocking layer.

In one aspect of the present invention is a method for depositing a high integrity protective coating. The method includes the steps preparing a substantially homogenous resin based planarizing layer composition, providing at least one surface for deposition, depositing the planarizing layer composition on the surface and curing the planarizing layer composition. In one aspect of the present invention, the deposition of a planarizing layer can be either batch mode process or roll-to-roll mode process, can be selected from the group consisting of reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, spin coating, dip coating, lithographic process, langmuir process and flash evaporation. In one aspect of the invention, the planarizing layer composition comprises at least one resin. In a further aspect of the present invention, the resin is an epoxy based resin. In another aspect of the present invention, the resin is an acrylic based resin. The method of the present invention may further include the steps of adding at least one flexibilizing agent, adhesive agent, surfactant or catalyst or combinations thereof in the planarizing layer composition. In still another aspect of the present invention the planarizing layer composition may be cured. The curing may be radiation curing or thermal curing. In one aspect of the present invention, said radiation curing is ultraviolet curing. The method further includes the steps of depositing reaction or recombination products of reacting species on the planarizing layer, and changing the composition of the reactants fed into the reactor chamber during deposition to form an organic-inorganic composition barrier coating layer.

The organic-inorganic composition barrier coating layer may be formed by one of many deposition techniques, such as plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including reactive sputtering, electron-cyclotron-resonance plasma-enhanced chemical-vapor deposition (ECRPECVD"), inductively coupled plasma-enhanced chemical-vapor deposition ("ICPECVD"), or combinations thereof. Suitable coating compositions for the organic-inorganic composition barrier layer across the thickness, are organic, ceramic or inorganic materials and combinations thereof. These materials are typically reaction or recombination products of reacting plasma species and are deposited onto the substrate surface. Organic coating materials typically comprise carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, aromatics, etc., having up to 15 carbon atoms. Inorganic and ceramic coating materials typically comprise oxide; nitride; carbide; boride; or combinations thereof of elements of Groups IIA, IIIA, IVA, VA, VIA, VIIA, IB, and IIB; metals of Groups IIIB, IVB, and VB; and rare-earth metals.

A further aspect of the invention is a device assembly comprising a device, at least one surface of which is coated with at least one high integrity protective coating. Such device assemblies include, but are not limited to, liquid crystal displays, light emitting devices, photo-responsive devices, integrated circuits and components of medical diagnostic systems.

The device assembly may comprise a device disposed on a flexible substantially transparent substrate, said substrate having a first substrate surface and a second substrate surface, at least one of said substrate surface being coated with the high integrity protective coating of the present invention.

EXAMPLE 1

A composition comprising 100 parts by weight liquide cycloaliphatic diepoxide (Dow Chemical ERL4221d), 1 part by weight Octacat UV sensitive catalyst (General Electric UV9392C) and 0.15 parts by weight of a surfactant (3M Fluorad FC430) were blended together, flitered through a 1 micron filter, degassed and applied to a plastic substrate by spin coating. Immediately after coating, the layer was exposed to a mercury arc lamp broadband UV source for 30 seconds which activates the catalyst and then the part was baked in an oven at 125 C for 1 hour to complete the cure of the epoxy resin. An organic-inorganic composition barrier coating layer is deposited over the planarizing layer.

EXAMPLE 2

A composition comprising ERL4299, Octacat UV sensitive catalyst (General Electric UV9392C) and a surfactant (3M Fluorad FC430) were blended together, flitered through a 1 micron filter, degassed and applied to a plastic substrate by spin coating. Immediately after coating, the layer was exposed to a mercury arc lamp broadband UV source for 30 seconds which activates the catalyst and then the part was baked in an oven to complete the cure of the epoxy resin. An organic-inorganic composition barrier coating layer is deposited over the planarizing layer.

EXAMPLE 3

A composition comprising siloxane containing epoxy such as Silar Labs Product 2283 (cycloaliphatic epoxy disiloxane), Octacat UV sensitive catalyst (General Electric UV9392C) and a surfactant (3M Fluorad FC430) were blended together, flitered through a 1 micron filter, degassed and applied to a plastic substrate by spin coating. Immediately after coating, the layer was exposed to a mercury arc lamp broadband UV source for 30 seconds which activates the catalyst and then the part was baked in an oven to complete the cure of the epoxy resin. An organic-inorganic composition barrier coating layer is deposited over the planarizing layer.

EXAMPLE 4

A composition comprising liquide cycloaliphatic diepoxide (Dow Chemical ERL4221d), Octacat UV sensitive catalyst (General Electric UV9392C) and a surfactant (3M Fluorad FC430) were blended together, flitered through a 1 micron filter, degassed and applied to a plastic substrate by spin coating. Immediately after coating, the layer was exposed to a mercury arc lamp broadband UV source for 30 seconds which activates the catalyst and then the part was baked in an oven at 125 C for 1 hour to complete the cure of the epoxy resin. An organic-inorganic composition barrier coating layer is deposited over the planarizing layer. Then, a composition comprising liquide cycloaliphatic diepoxide (Dow Chemical ERL4221d), Octacat UV sensitive catalyst (General Electric UV9392C) and a surfactant (3M Fluorad FC430) is spin coated over the organic-inorganic composition barrier coating layer. A transparent conductive coating comprising tin doped indium oxide (ITO) is then deposited over the second planarizing layer.

The previously described embodiments of the present invention have many advantages, including having substantial barrier properties. The coatings of the present invention would be useful as high integrity protective coatings in many optical and optoelectronic devices including organic light-emitting devices and organic photovoltaic devices.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A composite article comprising: at least one high integrity protective coating, said high integrity protective coating comprising at least one organic-inorganic composition barrier coating layer and at least one planarizing layer, wherein the barrier coating layer comprises a substantially organic zone and a substantially inorganic zone and an organic-inorganic interface zone between the substantially organic zone and the substantially inorganic zone.

2. The composite article of claim 1, wherein the planarizing layer thickness is in the range of about I nanometer to about 100 microns.

3. The composite article of claim 2, wherein the planarizing layer thickness is in the range of about 100 nanometer to about 10 micron.

4. The composite article of claim 3, wherein the planarizing layer thickness is in the range of about 500 nm to about 5 microns.

5. The composite article of claim 1, further comprising a substrate.

6. The composite article of claim 5, wherein said substrate with said high integrity protective coating exhibits an $R_a$ value less than about 4 nanometers.

7. The composite article of claim 5, wherein said substrate with said high integrity protective coating exhibits an $R_a$ value less than about 2 nanometers.

8. The composite article of claim 5, wherein said substrate with said high integrity protective coating exhibits an $R_a$ value less than about 0.75 nanometers.

9. The composite article of claim 5, wherein said substrate with said leveling coating exhibits an $R_p$ value less than about 5.5 nanometers.

10. The composite article of claim 5, wherein said substrate with said high integrity protective coating has an oxygen transmission rate of less than about 0.1 $cm^3/(m^2day)$, as measured at 25° C. and with a gas containing 21 volume-percent oxygen.

11. The composite article of claim 5, wherein said substrate with said high integrity protective coating has a water vapor transmission rate of less than about 1 $\times 10^{-2}$ g/($m^2$day), as measured at 25° C. and with a gas having 100-percent relative humidity.

12. The composite article of claim 5, wherein said substrate with said high integrity protective coating has a light transmittance greater than 85% in a selected wavelength range between about 400 nanometers to about 700 nanometers.

13. The composite article of claim 5, wherein the substrate is polycarbonate.

14. The composite article of claim 1, wherein the planarizing layer comprises a resin based composition.

15. The composite article of claim 14, wherein said planarizing layer comprises an epoxy resin based composition.

16. The composite article of claim 1, wherein said planarizing layer comprises an acrylic resin based composition.

17. The composite article of claim 1, wherein said planarizing layer further comprises a flexibilizing agent.

18. The composite article of claim 1, wherein said planarizing layer further comprises a surfactant.

19. The composite article of claim 1, wherein said planarizing layer comprises a UV radiation cured composition.

20. The composite article of claim 1, wherein said planarizing layer comprises a thermally cured composition.

21. The composite article of claim 1, wherein said high integrity protective coating is disposed over at least one surface of said substrate.

22. The composite article of claim 1, wherein said high integrity protective coating encapsulates said substrate.

23. The composite article of claim 1, wherein at least one high integrity protective coating is disposed over at least one surface of at least one element of the composite article.

24. The composite article of claim 1, wherein at least one high integrity protective coating encapsulates the composite article.

25. The composite article of claim 1, wherein at least one high integrity protective coating encapsulates at least one element of the composite article.

26. The composite article of claim 1, wherein at least one element is an optoelectronic element.

27. The composite article of claim 1, wherein the optoelectronic element is an organic element.

28. The composite article of claim 1, wherein the optoelectronic element is electroluminescent.

29. The composite article of claim 1, wherein the optoelectronic element is photoresponsive.

30. A composite article, comprising: a protective coating comprising: a barrier coating layer comprising a substantially organic zone and a substantially inorganic zone and an organic-inorganic interface zone between the substantially organic zone and the substantially inorganic zone, and a planarizing layer comprising an epoxy resin based composition and a flexibilizing agent.

31. The article as defined in claim 30, wherein the interface zone is a transition zone having a thickness that is in a range of from about 5 nanometers to about 30 nanometers.

32. The article as defined in claim 30, wherein the planarizing layer further comprises a UV catalyst, and the planarizing layer is UV radiation curable.

* * * * *